(12) United States Patent
Su et al.

(10) Patent No.: US 7,756,266 B2
(45) Date of Patent: Jul. 13, 2010

(54) DEVICE FOR VOLTAGE-NOISE REJECTION AND FAST START-UP

(75) Inventors: Peng-Un Su, Taipei (TW); Horng-Yuan Shih, Taipei (TW); Ming-Ching Kuo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1245 days.

(21) Appl. No.: 11/266,414

(22) Filed: Nov. 3, 2005

(65) Prior Publication Data

US 2007/0115061 A1    May 24, 2007

(51) Int. Cl.
*H04M 1/00* (2006.01)
*H04M 9/00* (2006.01)

(52) U.S. Cl. ...................................... 379/413
(58) Field of Classification Search ................... 379/413
See application file for complete search history.

(56) References Cited

U.S. PATENT DOCUMENTS

| 6,144,195 | A | 11/2000 | Afghahi et al. |
| 6,236,262 | B1 | 5/2001 | Mellot |
| 6,278,320 | B1 | 8/2001 | Vu |
| 2003/0169872 | A1 | 9/2003 | Enriquez et al. ............ 379/387 |
| 2004/0021506 | A1* | 2/2004 | Tanase ....................... 327/552 |

FOREIGN PATENT DOCUMENTS

| JP | 2004-252886 A | 9/2004 |
| TW | 410346 | 11/2000 |
| TW | 472383 | 1/2002 |
| TW | 200301619 | 7/2003 |
| TW | 200418271 | 9/2004 |
| TW | 1237168 | 8/2005 |

OTHER PUBLICATIONS

Hakkinen, Rahkonene, and Kostamovaara proposed in the article "An integrated programmable Low-Noise Charge Pump" (Proceedings of ICECS, 1999).

* cited by examiner

*Primary Examiner*—Alexander Jamal

(57) ABSTRACT

A device for voltage-noise rejection and fast start-up is provided. It comprises a low-pass filter connected to a voltage source, a voltage-controlled switch connected in parallel with the low-pass filter, and an auxiliary start-up element connected to a DC-only voltage output. By using a transistor operating in the triode region and a capacitor with suitable capacitance, it is suitable for integration to form a low-frequency low-pass pole to suppress the noise in the reference current. The auxiliary start-up element overcomes the large turn on time caused by the low frequency low-pass pole. As there is no static current during normal operation, the power consumption for the device is low.

9 Claims, 8 Drawing Sheets

DEVICE FOR VOLTAGE-NOISE REJECTION AND FAST START-UP

FIELD OF THE INVENTION

The present invention generally relates to a device for noise rejection in a reference voltage source, and more specifically to a device with a start-up mechanism to compensate the delay in start-up caused by a noise rejection filter.

BACKGROUND OF THE INVENTION

As the deep sub-micron technology improves, the device geometry has been greatly reduced, which leads to the reduction of the operating voltage, as well as the signal amplitude of the circuit. Under such circumstances, noise is becoming more prominent than before. To maintain the signal-to-noise ratio (SNR) under an acceptable level to keep the circuit functions, various solutions have been proposed to reduce the noise appearing in the circuit. This is especially true for the noise appearing in the reference voltage sources.

The conventional techniques to suppress the reference noise are to use a large capacitor and a large resistor on the signal path to form a low-pass pole for filtering the noise. However, in the IC design, a large capacitor and a large resister will occupy a large chip area, which is not economically viable. Therefore, these approaches are rarely used in practice, except in a limited application where integration and monolithic design takes less priority than the needs of the reference noise suppression. Even in those applications, there exists additional problem, such as the large circuit switching on/off delay.

Hakkinen, Rahkonene, and Kostamovaara proposed in the article "An integrated programmable Low-Noise Charge Pump" (Proceedings of ICECS, 1999) a design of an integrated programmable charge pump based on an op-amp current mirror, as shown in FIG. 1. The design is applicable to the charge pump of the lock-phase loop, which has strict requirements in terms of noise level. The prior art uses an op-amp 101 to construct a feedback circuit, and, based on the negative feedback mechanism, the noise of the current source $I_D$ is suppressed by the loop gain provided by the op-amp 101. However, the prior art does not suppress the noise in the reference source $V_{ref}$. The reference noise is converted by a resistor 103 and injected into the circuit.

U.S. Patent Publication 2003/0169872 disclosed a voltage reference filter for subscriber line interface circuit, as shown in FIG. 2. As shown therein, the direct current (DC) component of the reference signal is first filtered by a high-pass RC filter (capacitor 201 and resistor 202). The alternating current (AC) component passes the amplifiers 203, 204, and then a subtracting circuit 205 is used to subtract the AC component from the reference signal to obtain the DC component of the reference signal. However, for the high-pass filter to be effective, the RC value must be sufficiently large, which may even require the use of external elements. In addition, this prior art employs multiple amplifiers and hence consumes a considerable amount of static current. Therefore, although this prior art is applicable to the subscriber line, it is not generally applicable to other systems that demand low manufacturing cost, small device geometry and high integration.

FIG. 3 shows a conventional current mirror. A current mirror is a circuit to copy a current flowing through one active device by controlling the current in another active device of a circuit, keeping the output current constant regardless of a loading. The current being copied can be a varying signal current. Current mirrors also allow current signals to have a fanout greater than one and each output can be scaled using appropriate W/L ratios. Another important function of the current mirror is to reverse the current direction. As shown in FIG. 3, a reference current $I_{REF}$ is mirrored to transistor $M_2$ through transistor $M_1$, then mirrored to transistor $M_4$ through transistor $M_3$, and finally flows to the circuits requiring the current.

Reference current $I_{REF}$ is a fixed current generated by another circuit block, which, in general, is a bandgap reference voltage generator. As shown in FIG. 3, the noise in reference current $I_{REF}$ will flow along with the DC component to be mirrored from M1 to $M_4$, and enters the operating circuit through $M_4$. Along the current flow, more noise current from $M_1$, $M_2$, and $M_3$ will be added. All the noise currents, if not suppressed, will greatly affect the noise characteristic of the operating circuit.

To suppress these noises, a conventional method is to place a large capacitor at the gate of $M_4$, as the capacitor $C_1$ shown in FIG. 3. Capacitor $C_1$ and transistor $M_3$ form a low-pass pole to perform a first-order filtering for the noise. The location of the pole is $g_{m3}/C_1$, where $g_{m3}$ is the conductance of transistor $M_3$. For example, if $g_{m3}$ is 0.9 mA/V, a capacitor $C_1$ of 10 pF integrated into an IC can create a 14 MHz pole. However, to filter noise of even lower frequency, the required capacitance will be even larger, which makes the integration even harder.

Another technique is to place a resistor with large resistance between $M_3$ and $C_1$. Similarly, the resistor and $C_1$ form a low-pass pole to perform a first-order filtering for the noise. Although the integrated resistor occupies a smaller area, it still requires a rather large resistance and large capacitance to generate a pole of sufficiently low frequency. Therefore, the overall integrated area is still considerably large.

FIG. 4 shows a simplified block diagram of the operation of a filter used in conjunction with a voltage source. $V_{in}$ is a source consisting of a DC component and high-frequency noise component. Assume that a very low frequency pole is introduced such that the low-pass filter filters out the high-frequency noise component while allowing the DC component to pass; hence the $V_{out}$ consists of only the DC component. However, the changes in $V_{out}$, for example, on and off, cannot react as immediately as the changes in $V_{in}$ because of the large time constant introduced by the filter.

SUMMARY OF THE INVENTION

The present invention has been made to overcome the above-mentioned drawback of conventional techniques to reduce the reference noise. The primary object of the present invention is to provide a device for noise rejection in the reference current to reduce the impact of the noise to the SNR.

Another object of the present invention is to provide a reference noise rejection device that uses a fast start-up mechanism to overcome the delay problem caused by the low frequency low-pass pole.

Yet another object of the present invention is to provide a reference noise rejection device that is small in chip area and without static current consumption.

To achieve the above objects, the present invention provides a device for voltage-noise rejection and fast start-up, which comprises a low-pass filter connected to a voltage source, a voltage-controlled switch connected in parallel with the low-pass filter, and an auxiliary start-up element connected to a DC-only voltage output. By using a transistor operating in the triode region with large resistance and a capacitor with mediate capacitance. It is possible to integrate these devices and to form a low-frequency low-pass pole for suppressing the noise in the reference current. The auxiliary start-up element overcomes the switch delay caused by the low frequency low-pass pole.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 5:
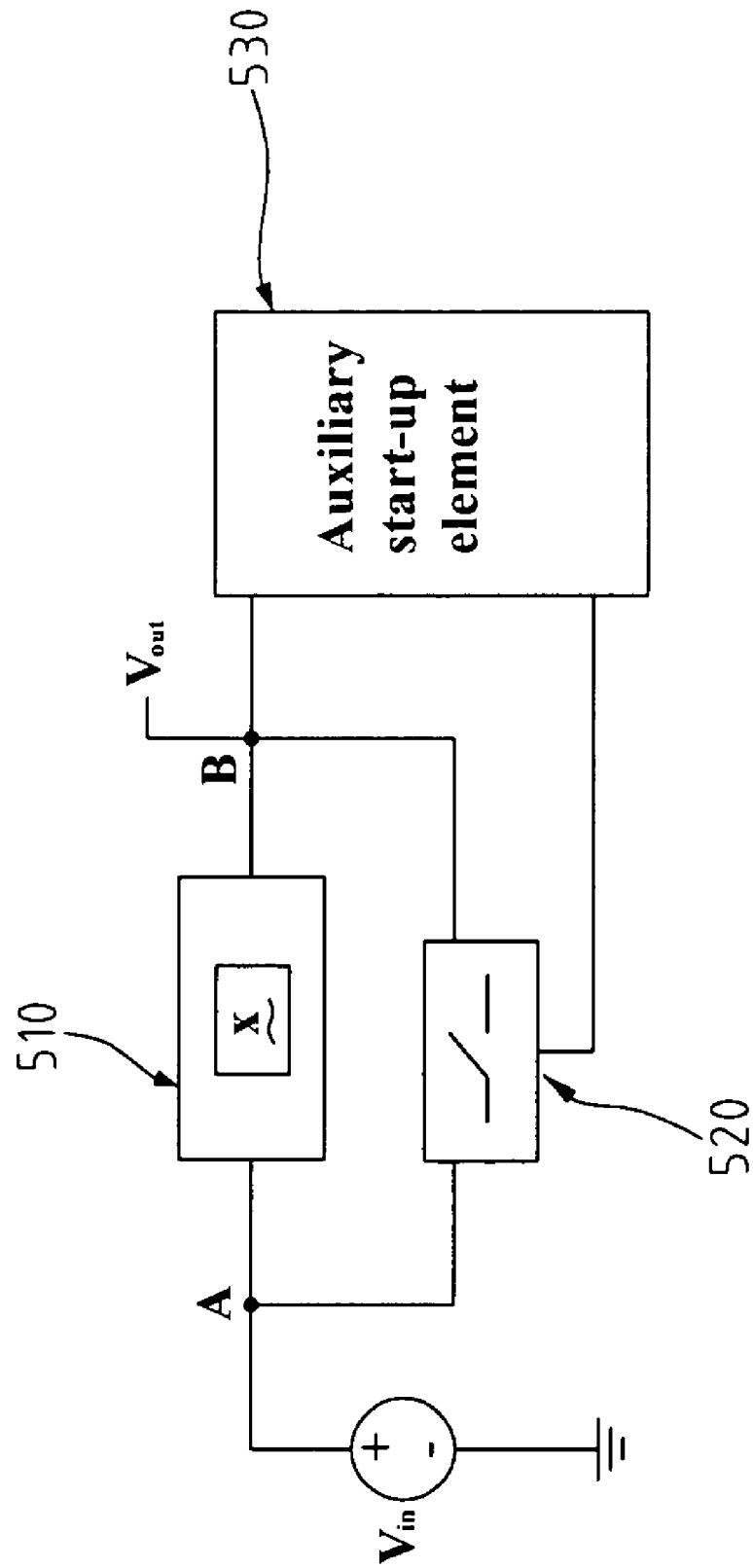
FIG. 5 shows a schematic view of a block diagram of a current mirror according to the present invention.

FIG. 5 shows a schematic view of a block diagram of the present invention. As shown in FIG. 5, a device for voltage-noise rejection and fast start-up of the present invention includes a low-pass filter 510, a voltage-controlled switch 520, and an auxiliary start-up element 530. The low-pass filter 510 is connected to a voltage source $V_{in}$ for filtering out the high-frequency noise to produce a DC-only $V_{out}$, so that the voltage at node B has the same DC voltage at node A but without the noise. The voltage-controlled switch 520 is connected in parallel with low-pass filter 510 at A and B for bypassing low-pass filter 510 when the circuit starts up. Once the circuit is fully turned on, voltage-controlled switch 520 will be open to allow low-pass filter 510 to operate. The auxiliary star-up element 530 is connected to B and outputs a control voltage to voltage-controlled switch 520.

Figure 6:
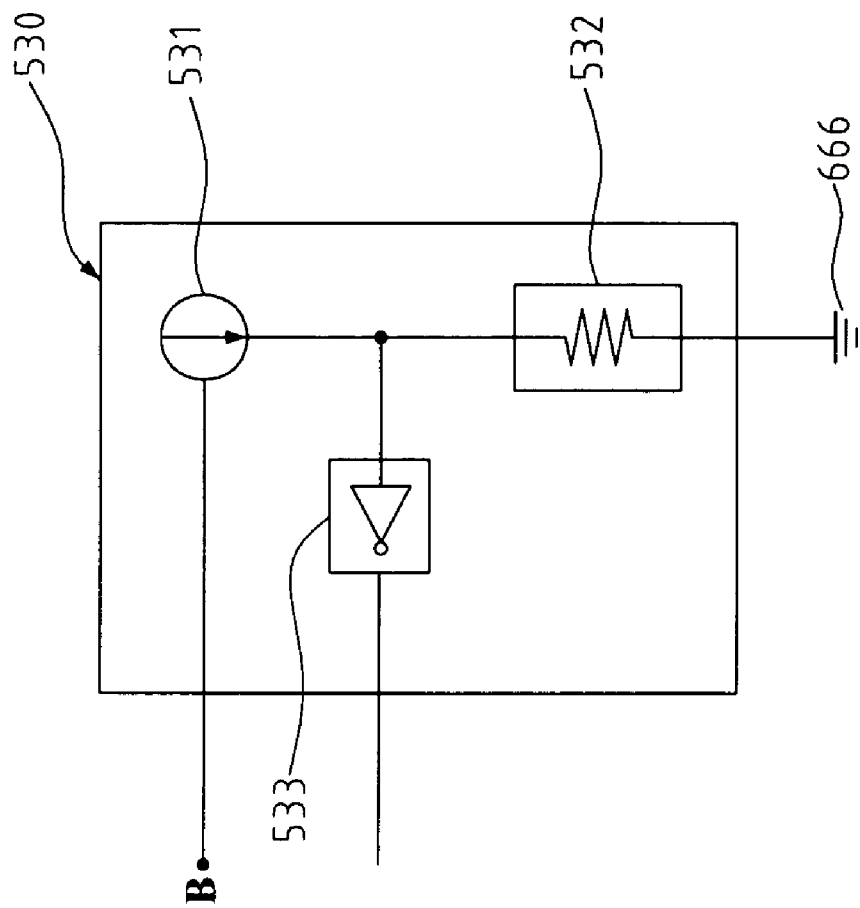
FIG. 6 shows a schematic view of a block diagram of the auxiliary start-up element of FIG. 5.

FIG. 6 shows a schematic view of a block diagram of the auxiliary start-up element of FIG. 5. As shown in FIG. 6, the auxiliary start-up element 530 further includes a voltage-controlled current source 531, a load 532, and a threshold voltage detector 533. The voltage-controlled current source 531 is connected to B to convert the voltage to a current. The load 532 is connected to the output of voltage-controlled current source 531 and a ground end 666 to convert the current from voltage-controlled current source 531 to a voltage to provide to the threshold voltage detector 533. The threshold voltage detector 533 detects the voltage of the load 532 and sends out a voltage to open the voltage-controlled switch 520 when the voltage on load 532 exceeds the threshold.

Figure 7:
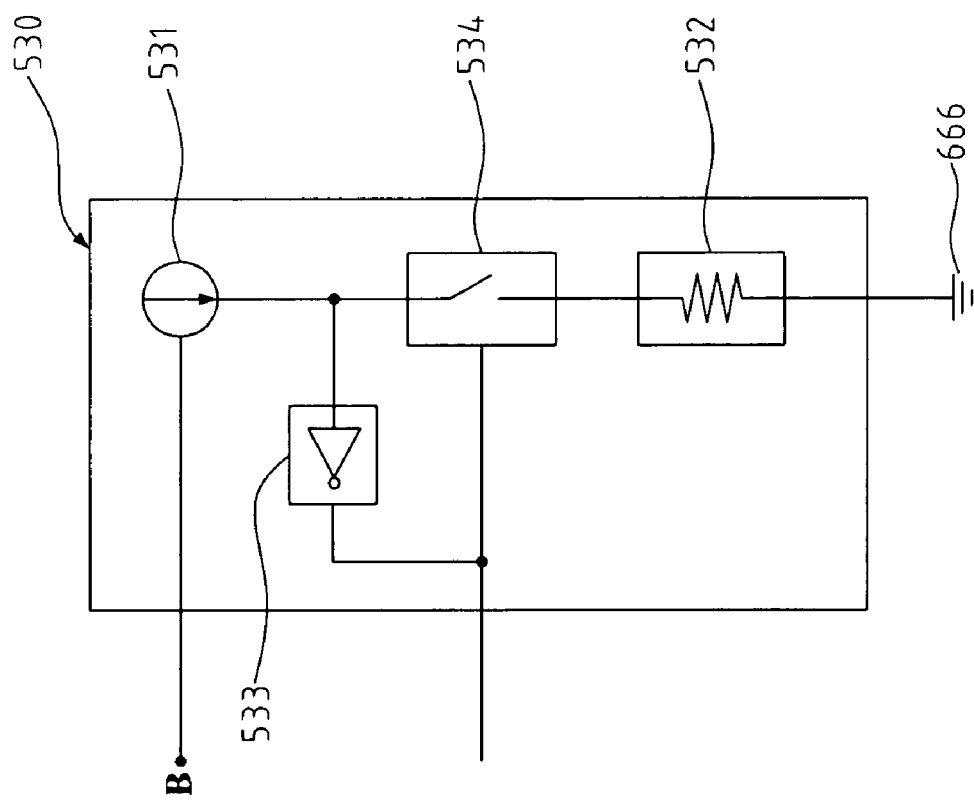
FIG. 7 shows another schematic view of a block diagram of the auxiliary start-up element of FIG. 5.

The auxiliary start-up element 530 can further include an auxiliary voltage-controlled switch 534, as shown in FIG. 7, which shows another example of a block diagram of the auxiliary start-up element of FIG. 5. The purpose of the auxiliary voltage-controlled switch 534 is to switch open the load 532 when the circuit is fully turned on so that the voltage-controlled current source 531 will be turned off to save the current consumption.

The operation of the auxiliary start-up element 530 is as follows. When the voltage at B reaches the steady state, the current output from voltage-controlled current source 531 is I. With load 532 having the resistance R, the voltage on load 532 will be I*R when the voltage at B reaches the steady state. Therefore, the threshold voltage detector 533 must be designed to send out a control voltage to switch open the voltage-controlled switch 520 when the voltage from load 532 is equal to I*R.

Figure 8:
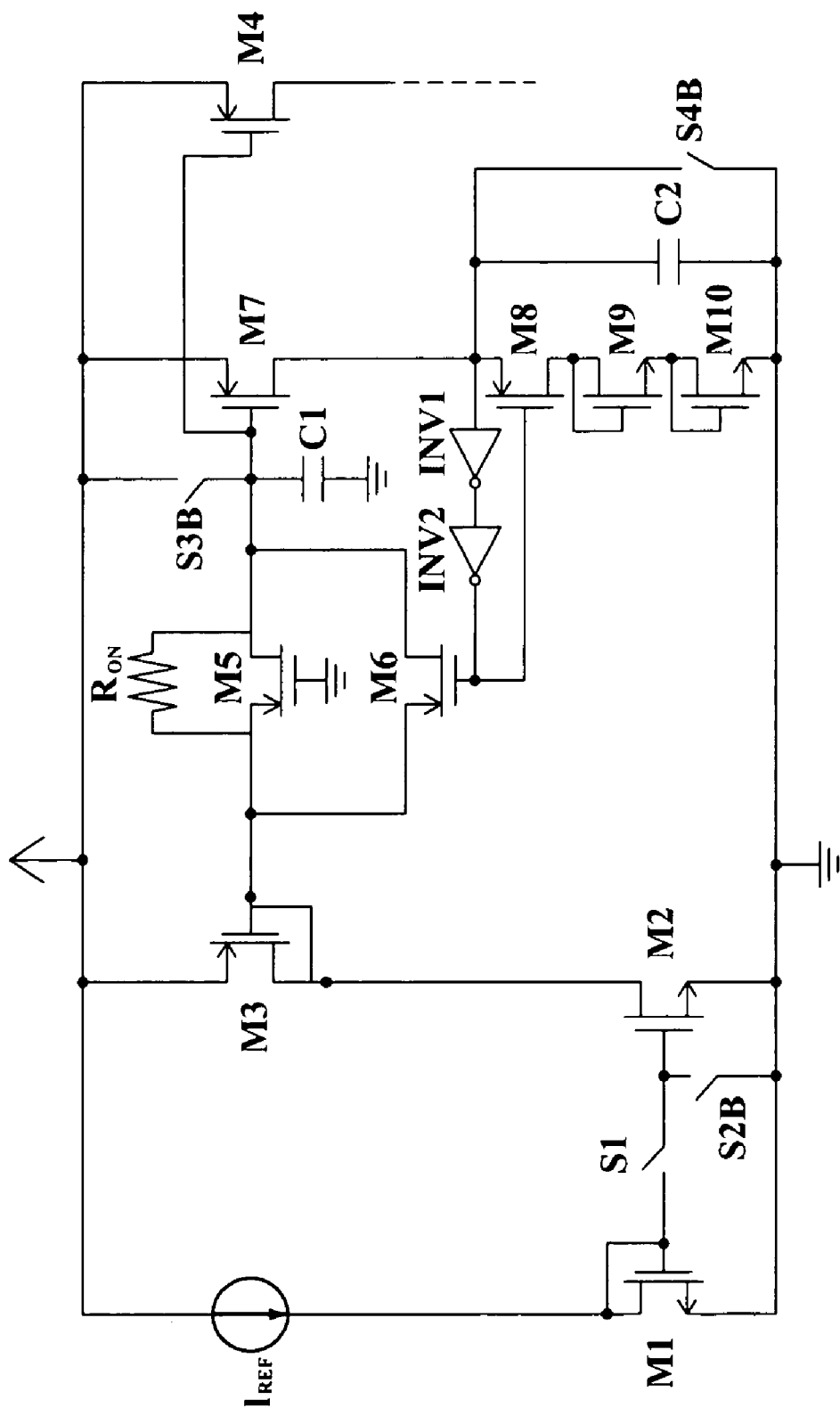
FIG. 8 shows a detailed circuit of an embodiment of the present invention.

FIG. 8 shows an equivalent circuit of an embodiment of the present invention. As shown in FIG. 8, a transistor $M_5$ and a capacitor $C_1$ form low-pass filter 510 of FIG. 5. Similarly, transistor M6 forms the voltage-controlled switch 520 of FIG. 5, and the circuit of $M_7$-$M_{10}$ forms the auxiliary start-up element 530 of FIG. 5.

Figure 1:
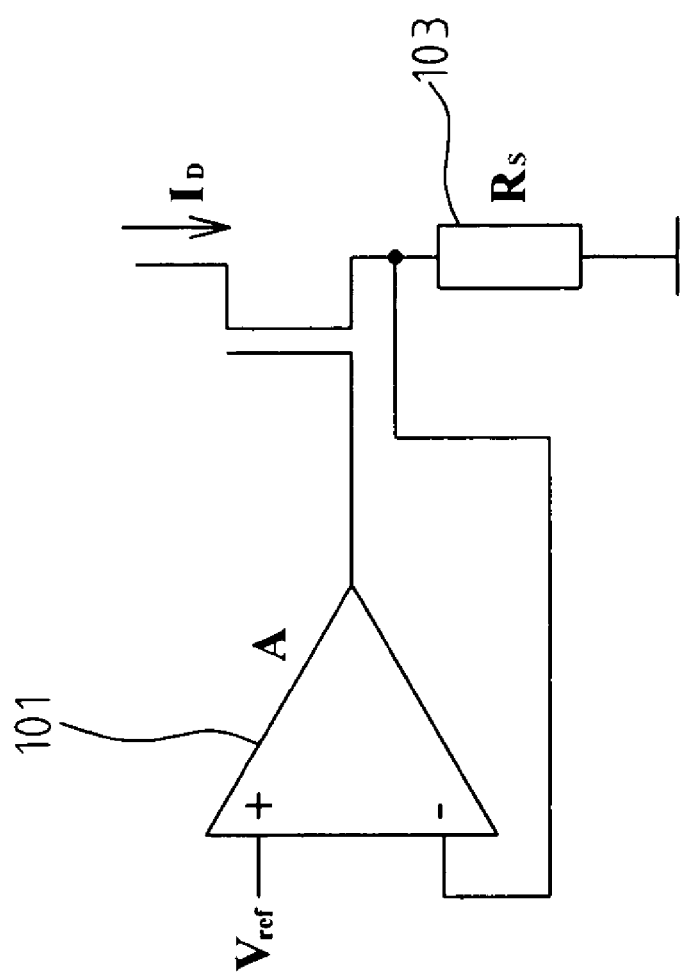
FIG. 1 shows an integrated programmable low-noise charge pump of a prior art.
Figure 2:
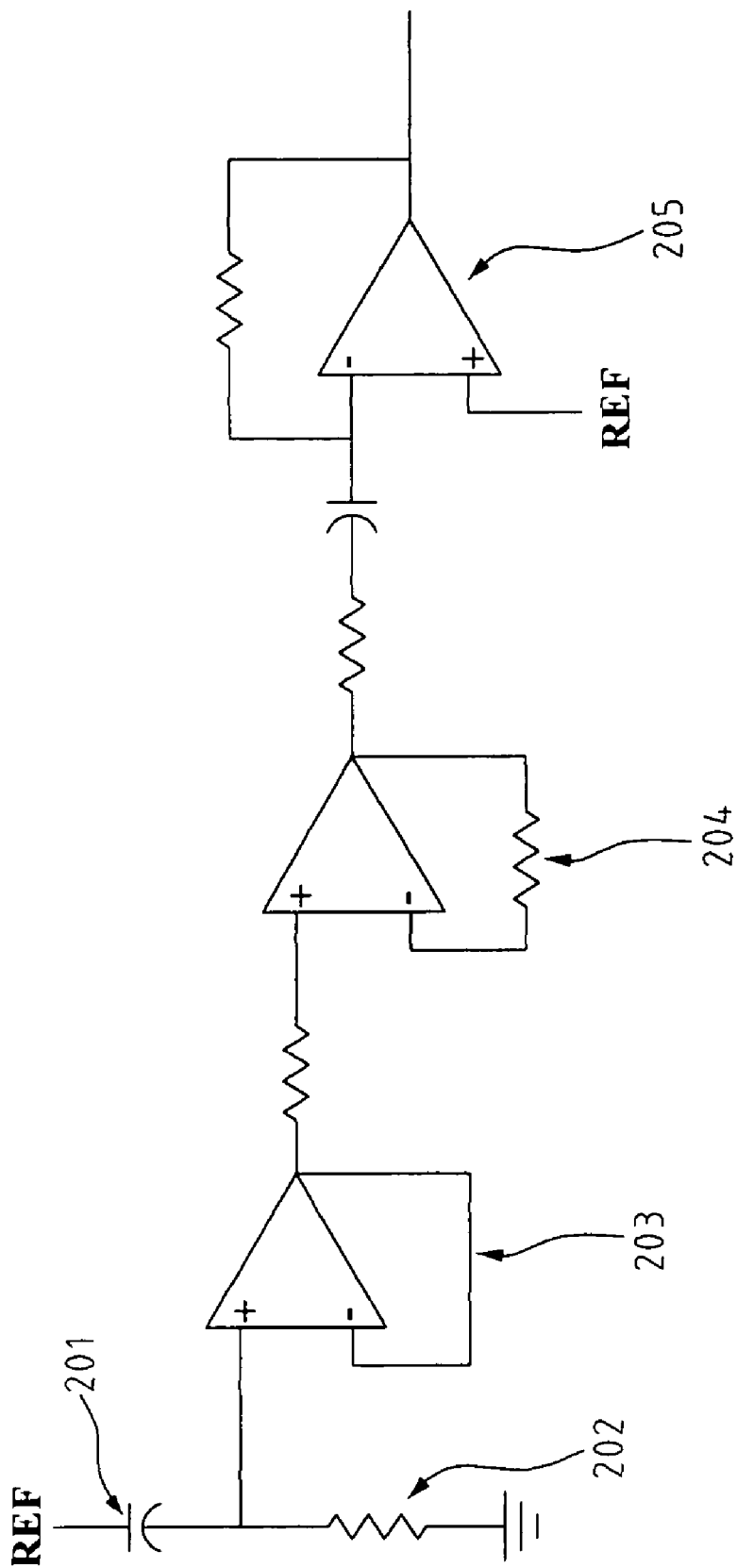
FIG. 2 shows a voltage reference filter for subscriber line interface circuit of a prior art.
Figure 3:
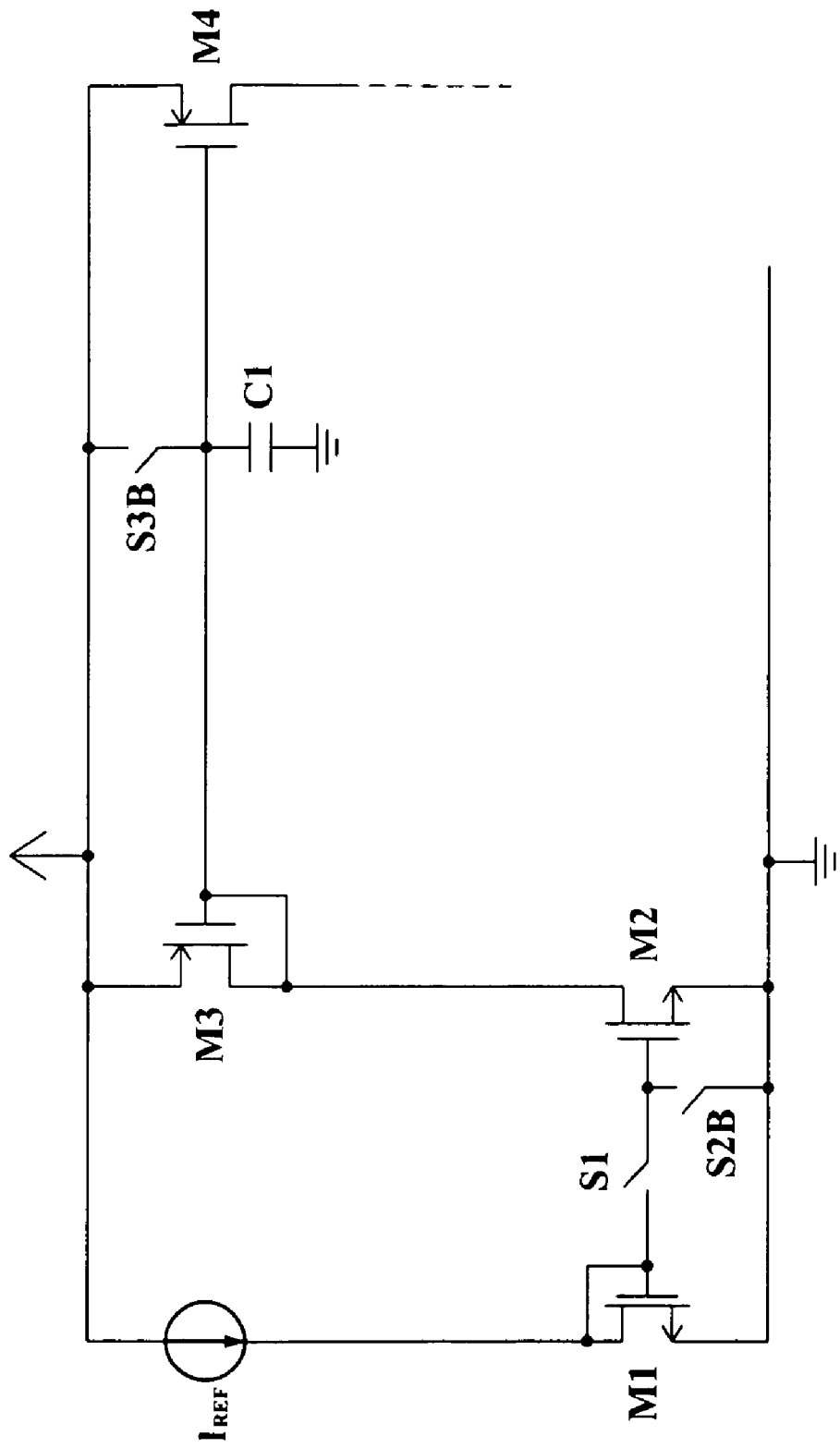
FIG. 3 shows a conventional current mirror.
Figure 4:
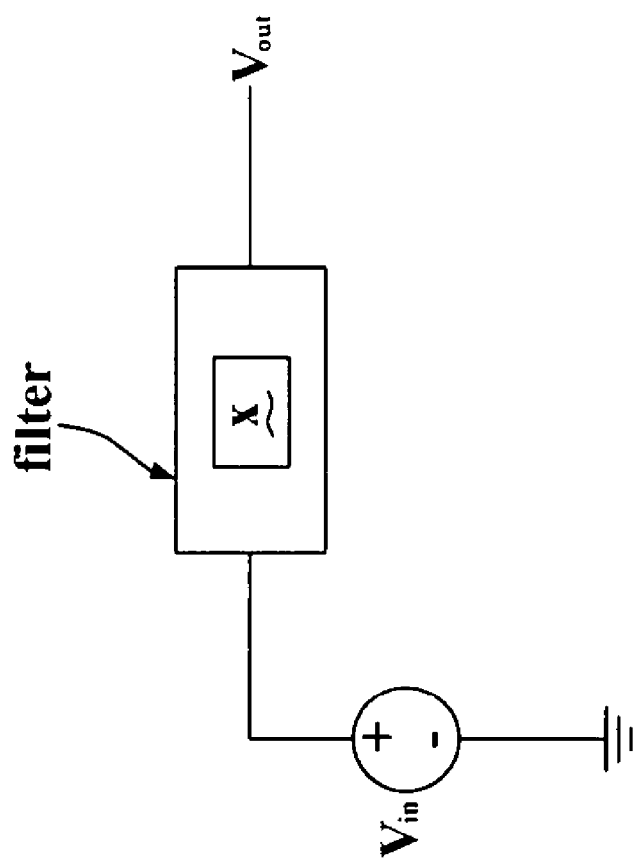
FIG. 4 shows a filter used to reject the high-frequency noise in a voltage source.

In comparison with the circuit shown in FIG. 3, in the circuit shown in FIG. 8, a transistor $M_5$ operating in the triode region is used to act as a large resistor. Transistor $M_5$ can be designed to have a small aspect ratio, W/L, such that it has a large turn-on resistance. For example, in the 0.18 um process, a transistor with W/L=0.25 um/10 um can have a resistance of 1.1 MΩ. In conjunction with a 10 pF capacitor $C_1$, a low-pass pole of 16 kHz can be obtained. Furthermore, a plurality of transistors can be used to increase the resistance if a single transistor is insufficient.

The operation of transistors $M_6$, $M_7$-$M_{10}$ is described as follows. When the circuit is turned off, $S_1$ is opened, and $S_{2B}$-$S_{4B}$ are closed; therefore, $M_6$ becomes conductive with a small resistance and $M_7$ is non-conductive. When the circuit receives the start-up signal, $S_1$ is closed, and $S_{2B}$-$S_{4B}$ are opened. Because $M_6$ has a small resistance, the low-pass pole that $C_1$ forms is moved to a higher frequency, and the gate voltages on $M_4$ and $M_7$ will change rapidly as the gate voltage changes on $M_3$. Hence, the current of $M_4$ and $M_7$ will be turned on immediately. When the current of $M_7$ increases, the drain voltage of $M_7$ also increases. When $M_7$ is close to fully turned on, the drain voltage reaches the threshold to drive $INV_1$ and $INV_2$. The gate voltage of $M_6$ changes from low to high, and $M_6$ becomes open-circuit. The low-pass pole returns from high frequency to low frequency for noise rejection. At this point, the circuit returns to normal operation.

It is worth noticing that the gate of $M_6$ and the gate $M_8$ are connected. That is when $M_6$ is open-circuited, so is $M_8$. In this case, there will be no current flowing through $M_7$. Therefore, when the circuit is fully turned on, there will be no static current flowing through $M_7$. Therefore, transistor $M_7$ only consumes current during the start up process.

In addition, $M_6$ is open-circuited only when there is sufficient current on $M_7$. A certain delay can be added to the feedback control loop of $M_6$ to guarantee that $M_6$ will not be turned off before the start-up is over. Therefore, a small capacitor $C_2$ is added to the drain of $M_7$ to increase the charge time of $M_7$ drain in order to prolong the conductive time of $M_6$.

With the present invention, the noise in the reference current can be rejected and the delay in start-up can be avoided. In addition, the present invention is mostly implemented with transistors, which is suitable for integration. As there is no static current during normal operation, the power consumption is low.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A device for voltage-noise rejection and fast start-up, applicable to suppressing noise in a voltage source, said device comprising:
   a low-pass filter connected to said voltage source for filtering out high-frequency noise and producing a DC-only voltage output, where DC denotes direct current;
   a voltage-controlled switch connected in parallel with said low-pass filter and bypassing said low-pass filter during start-up; and
   an auxiliary star-up element connected to said DC-only voltage output and providing a voltage to said voltage-controlled switch for voltage control;
   wherein said auxiliary start-up element further comprises:
      a voltage-controlled current source, connected to said DC-only voltage output to convert said voltage output to a current;
      a load, connected to an output of said voltage-controlled current source and a ground end to convert said current from said voltage-controlled current source to a voltage; and
      a threshold voltage detector for comparing said voltage of said load with a threshold.

2. The device as claimed in claim 1, wherein said device is a current mirror.

3. The device as claimed in claim 1, wherein said low-pass filter further comprises at least a capacitor and at least a resistor.

4. The device as claimed in claim 3, wherein said resistor is a transistor operating in the triode region.

5. The device as claimed in claim 3, wherein said capacitor is an equivalent capacitor of a transistor.

6. The device as claimed in claim 1, wherein said voltage-controlled switch is a transistor with a gate connected to said auxiliary start-up element.

7. The device as claimed in claim 1, wherein said threshold voltage detector sends out a control voltage to turn off said voltage-controlled switch when said threshold is reached.

8. The device as claimed in claim 1, further comprising an auxiliary voltage-controlled switch connected in series between said voltage-controlled current source and said load.

9. The device as claimed in claim 8, wherein said auxiliary voltage-controlled switch is turned off when said device is not in start-up phase to save static current consumption.

* * * * *